United States Patent [19]

Sriram et al.

[11] Patent Number: 5,267,336
[45] Date of Patent: Nov. 30, 1993

[54] ELECTRO-OPTICAL SENSOR FOR DETECTING ELECTRIC FIELDS

[75] Inventors: Sriram S. Sriram, Powell; Stuart A. Kingsley, Columbus; Joseph T. Boyd, Cincinnati, all of Ohio

[73] Assignee: Srico, Inc., Powell, Ohio

[21] Appl. No.: 878,420

[22] Filed: May 4, 1992

[51] Int. Cl.$^5$ .............................................. G02B 6/10
[52] U.S. Cl. ................................... 385/2; 385/12; 385/129; 324/96; 356/345
[58] Field of Search ................................ 385/1-3, 385/12, 14, 129, 130, 142; 356/345, 359, 360; 250/227.21, 227.27; 324/95, 96, 97

[56] References Cited

U.S. PATENT DOCUMENTS

| | | | |
|---|---|---|---|
| 4,147,979 | 4/1979 | Baues et al. | 385/12 |
| 4,266,850 | 5/1981 | Burns | 385/8 |
| 4,284,663 | 8/1981 | Carruthers et al. | 65/30.13 |
| 4,439,265 | 3/1984 | Alferness et al. | 156/606 |
| 4,697,876 | 10/1987 | Dyott | 385/12 |
| 4,709,978 | 12/1987 | Jackel | 385/3 |
| 4,799,797 | 1/1989 | Huggins | 356/345 |
| 4,929,050 | 5/1990 | Wilson | 250/227.17 |
| 4,969,742 | 11/1990 | Falk et al. | 356/346 |
| 4,984,861 | 1/1991 | Suchoski, Jr. et al. | 385/2 |

OTHER PUBLICATIONS

Findakly, et al. "High Quality LiTaO3 Integrated Optical Waveguides . . . " Optics Letters 13 pp. 797–799 (1988).
Suchoski, et al. "Stable low loss proton exchange LiNbO3 . . . " Optics Letters 13 pp. 1050–1053 (1988).
Tasson et al., "Ferroelectric Study of Poling Mechanism in Lithium Niobate . . . ", Ferroelectrics 13 pp. 479–481 (1976).
Miyazawa, "Ferroelectric Domain Inversion in Ti Diffused . . . " J. Applied Phys. 50 pp. 4599–4603 (1979).
Thaniyavarn, et al al. "Domain Inversion Effects in TiLiNbO3 . . . " Appl. Phys. Lett. 46 pp. 933–935 (1985).
Haycock et al. "A Method of Poling LiNbO3 and LiTaO3 below Tc", Applied Phys Lett. 48 pp. 698–699 (1986).
Nakamura, et al. "Ferroelectric domain inversion caused in LiNbO3 . . . " Appl. Phys. Lett. 50 (2) pp. 1413–1414 (1987).
Lim et al "Second Harmonic Generation of Green Light in . . . " Electronics Letters 25, pp. 174–175 (1989).
Keys et al. "Fabrication of Domain Reversed Gratings for SHG . . . " Electronics Letters 26, pp. 188–190 (1990).
Nakamura et al. "Ferroelectric Inversion Layers Formed . . . " Appl. Phys. Lett. 56 pp. 1535–1536 (1990).
Ahlfeldt et al. "Periodic Domain Inversion in Lithium . . . " Integrated Photonics Research, Paper WC2 Apr. 1991
Bulmer et al. "Linear Interferometric Modulators in . . . " J. of Lightwave Tech., vol LT-2 No 4 Aug. 1984.
Bulmer et al. "Linear Ti:LiNbO3 Modulators at . . . " SPIE vol. 517 Int. Op. Cir. Eng. pp. 177–185 (1985).
Filter et al. "Photonic Measurements of Microwave . . . " SPIE vol 566 pp. 227–232 (1985).
Dochet, "Intergrated Electro-optic Modulators with . . . " SPIE 586 pp. 45–50 (1985).
Jarzynski et al. "Fiber Optic Electric Field Sensor . . . " SPIE vol 718 pp. 48–55 (1986).
Bulmer et al. "High Dynamic Range, Linear Modulators . . . " Topical Meeting on Int. and Guided Wave Optics, Mar. 1988.
Masterson et al. "Photonic Probes for the Measurement . . . " IEEE Symposium, Session 2B pp. 1–6 May 1989 Denver.
Randa et al. "Thermo-Optic Designs for Microwave . . . " IEEE Symposium, Session 2B pp. 7–11 May 1989 Denver.
Bulmer et al. "Phase Tuning of LiNbO3 Interferometric . . . " Int. Phot. Res. 1991 Tech. Digest, Paper WC5 p. 63 Apr. 1991.

*Primary Examiner*—Frank Gonzalez
*Attorney, Agent, or Firm*—Dennis H. Rainear

[57] ABSTRACT

The invention relates to an electric field sensor useful in detecting and measuring wideband transient electrical responses by means of an integrated optical waveguide interferometer. Mach-Zehnder devices are produced wherein one waveguide channel has been reverse poled, or has domain inversion, preferably by means of titanium diffusion into said waveguide channel. Also produced is an electrode-less optical interferometer modulator by which an optical output signal is modulated at the same frequency as an applied electric field.

30 Claims, 5 Drawing Sheets

ELECTRO-OPTICAL SENSOR FOR DETECTING ELECTRIC FIELDS

TECHNICAL FIELD

The invention relates to a non-metallic electric field sensor useful in the measurement of wideband transient electrical responses by means of an integrated optical waveguide interferometer. The non-metallic, electrodeless, selectively reverse poled design of the present invention minimizes the perturbation encountered when measuring the electric fields with conventional metal electrode Mach-Zehnder interferometers. The present invention thus allows more accurate measurement of electric fields.

BACKGROUND ART

Materials such as lithium niobate and lithium tantalate utilize the electro-optic properties of the crystal material for sensing electric field. The electric field modulates the optical beam propagating through the crystal.

In an electro-optic crystal, the refractive index of the material changes in proportion to the amplitude and direction of the applied electric field. The resulting change in the index of refraction of the crystal leads to a phase modulation in the light propagating in the crystal. The phase modulation of the light as it emerges at the output of the crystal is a direct measure of the electric field applied to the crystal.

Optical detectors measure the amplitude or intensity of the light beam but cannot measure the phase information in the light beam. One method of measuring phase modulation consists of converting the resultant phase shift to an amplitude or intensity modulation through the use of optical interferometers.

Optical interferometers can be fabricated using a bulk crystal material or an integrated optical waveguide in a crystal substrate. The integrated optical version is more efficient and has several advantages over the bulk crystal device.

An integrated optical waveguide device is a planar layer or a channel formed in a material adapted to a specific application. Some optical waveguide circuits may contain elements familiar from bulk optics such as mirrors, gratings, lenses, and, in suitable materials, electro optic, or acousto-optic, or magneto-optic modulators. In addition to their compatibility with optical fibers, other advantages of optical waveguide devices include permanent alignment of components, compatibility with existing planar processing technology, diffraction-free beam propagation, low voltage and/or power requirements, high modulation rates, and freedom from electromagnetic interference.

One popular waveguide device is the integrated optic Mach-Zehnder interferometer. The structure of a Mach-Zehnder interferometer consists of an input Y-branch, an output Y-branch, and two parallel waveguide channels that connect the two Y-branches.

An integrated optic Mach-Zehnder interferometer typically is fabricated by proton exchange or titanium diffusion into an electro-optic crystal material, such as lithium niobate, to form optical waveguide channels. The waveguide channels thus created have a higher refractive index region compared to the surrounding substrate material. Hence, light input into the channel is confined to propagate within the channel. Lithium niobate, $LiNbO_3$, has been one of the most extensively studied materials for integrated optic applications, primarily because of properties that lend themselves to simplicity of low-loss guided wave circuit fabrication and high electro-optic efficiency.

The integrated optic Mach-Zehnder interferometer consists of an input channel that propagates the light to the input Y-branch. At the input Y-branch, the light is equally split between the two channels of the interferometer. For a perfectly symmetric junction, the optical signal will be divided equally between the two legs of the interferometer. The two channels branch out at an angle of, for example, one degree, to a separation of, for example, about 50 microns. The two channels are bent so that they are parallel to each other over a length, L. The two parallel channels are then recombined at the output Y branch and the recombined light is transmitted into the output port. If the two inputs are equal and in phase, the output of the Y-branch will be equal to the sum of the two input intensities. But, if the amplitudes of the two inputs are equal but opposite in phase, the output of the Y-branch will be zero. The energy that does not reach the output leg is radiated into the substrate. In principle, the Y-branch is a four-port device; the three legs of the Y-branch account for three ports and the substrate is the fourth port.

The lengths of the two legs of the Mach-Zehnder interferometer are often designed to be unequal so that the recombining light beams are in phase quadrature with each other. This design condition permits operating the device in its linear region to yield optimum performance and the highest dynamic range.

By positioning appropriate electrodes on or near the parallel waveguide channels, this device can sense electric field. Thus, in a conventional electric field sensor, an external field to be measured is picked up by an antenna and converted to a voltage which is then applied to the electrodes on the lithium niobate crystal (FIG. 1).

Conventionally, electrodes are positioned on top of each waveguide channel in the crystal substrate to create electric fields in opposite directions in each of the two legs of the interferometer. The electrodes are connected so that the two parallel channels experience opposite polarities relative to each other. In one channel, the electric field vector is pointing in one direction, whereas in the other channel, the electric field vector is pointing in a direction opposite to that of the first field vector, thereby leading to a net phase shift of twice the phase shift per channel. The resulting change in the index of refraction of the crystal delays the light in one channel with respect to the light in the adjacent channel, resulting in a net phase shift. As a result, the interferometer operates in a push-pull fashion. When the light is recombined, a change in light intensity results due to the interference of the two light waves.

The interferometer can be operated such that the light intensity is proportional to the electric field across the crystal. However, the conventionally required electrodes and antennas perturb the electric field being measured and create frequency limitations due to their interactions with the electromagnetic fields.

In a variety of applications that require the measurement of electric fields, the presence of a metal electrode tends to disturb the electric field under measurement. In severe cases, the close proximity of the electrodes could create arcing, thus creating a short circuit. The metal electrode also tends to limit the frequency response of the sensor due to the capacitive nature of the electrical circuit. This electrical circuit could also pose a safety hazard in the presence of combustible or explosive materials.

For a Mach-Zehnder interferometer without any electrodes, when the device is placed in a uniform external field, both the channels experience the electric field vector in the same direction. As a result, the phase shift in the two channels is identical, and the net phase shift is zero. If one of the waveguide channels could have its ferroelectric domains reversed, then an external vertically directed electric field would produce equal and opposite phase shifts in the two channels, leading to a total phase shift as experienced by the conventional electroded device. Thus by selectively reverse poling one leg of a Mach-Zehnder interferometer, a non-metallic electric field sensor device could be fabricated.

BRIEF DISCLOSURE OF INVENTION

It is therefore one object of the present invention to provide an electric field sensor that does not require any metal electrodes.

Another object of the present invention is to provide an integrated optical waveguide device comprising a plurality of waveguide channels defined on a crystal material, wherein two of the waveguide channels have reverse polarity relative to each other.

A further object of the invention is to provide an electrode-less, non-metallic voltage sensor.

It is another object of this invention to provide an interferometer comprising a plurality of waveguide channels defined on a bulk crystal material, wherein two of the waveguide channels have reverse polarity relative to each other. The interferometer can be, for example, a Mach-Zehnder or a Michelson interferometer. The interferometer can be used as an electric field sensor and an electro-optical antenna.

It is a further object of the present invention to provide a non-metallic Mach-Zehnder interferometer in which the crystal material of one of two parallel or essentially parallel optical waveguide channels is at least partially and preferably 100% oppositely poled by one of several methods. According to the present invention, the waveguide channels need not be exactly parallel to each other to still be operative herein, provided the convergence or divergence does not adversely affect the operation of the interferometer. There can be a plurality of parallel or essentially parallel waveguide channels in the devices of the present invention, provided the polarity of at least one of the waveguide channels is reversed relative to that of at least one other channel. The waveguide channels are adapted to receive a divided optical signal. For this invention, such embodiments are all referred to herein as Mach-Zehnder interferometer devices.

Yet another object of the present invention is a method to produce an electrode-less, non-metallic, titanium diffused, selectively reverse poled, Mach-Zehnder interferometer, wherein said method does not heat or cool the device or any of its components above the Curie temperature of its components in the presence of an electric field. By "Curie temperature" or $T_c$ herein is meant the temperature of transition at which the ferroelectric crystal becomes merely paraelectric. This is also called the "Curie Point" and is usually lower than the melting point.

Yet another object of the present invention is a method to produce a Mach-Zehnder interferometer in which the difference in the optical path lengths of the two waveguide channels induces a desired phase bias relationship between the two recombining beams at the output Y-branch. In this manner, quadrature and $\pi$ radian phase bias relationships can be produced in the interferometers of this invention.

Thus, in one embodiment of the present invention, one leg of the interferometer is caused to be selectively reverse poled using diffusion of titanium into a lithium niobate crystal waveguide material. This is followed by a proton exchange treatment to the entire interferometer waveguide circuit. Thus, the proton exchange treatment is superimposed on the reverse poled leg of the interferometer.

In another embodiment of the present invention, the waveguide channels of devices of the present invention are selectively reverse poled by a means selected from (a) titanium diffusion of at least one but less than all of the waveguide channels at a temperature below $T_c$ of the waveguide material in the absence of an electric field, followed by proton exchange (b) titanium diffusion of at least one but less than all of the waveguide channels above $T_c$ of the waveguide material in the presence of an electric field followed by proton exchange, (c) titanium diffusion of an interferometer below the temperature for domain inversion followed by a temperature gradient effect induced by laser heating at least one but less than all of the waveguide channels and without subsequent proton exchange treatment, (d) selective electron beam bombardment of at least one but less than all of the waveguide channels, (e) titanium diffusion of both legs at a temperature above the $T_c$ of the waveguide material, each in the presence of a separate electric field, wherein said electric fields are opposite polarities and followed by either proton exchange treatment or titanium diffusion at a temperature below domain inversion, (f) proton exchange followed by heat treatment below the $T_c$ at least one but less than all of the waveguide channels, (g) laser and non-laser temperature gradient effect of at least one but less than all of the waveguide channels, and (h) ionic concentration gradient effect of at least one but less than all of the waveguide channels. These techniques have shown success in domain reversal in lithium niobate, and the concentration gradient technique is particularly well suited for applications in integrated optics.

The Mach-Zehnder interferometers of the present invention are capable of converting phase modulation of light to amplitude modulation of light. The interferometer can be operated such that the light intensity at the output is proportional to and modulated by the electric field experienced by the waveguide crystal.

In integrated optics, selective sections of an optical circuit require that the orientation of the spontaneous polarization be reversed compared to the polarity of the starting crystal material. The refractive index change in a selected region of an electro-optic crystal exposed to an electric field can be modified by partial or complete domain inversion, or polarity reversal. The electric field induced change in the refractive index in a 100% domain inverted region is equal and opposite to the refractive index change in the starting crystal material. For regions with less than 100% domain inversion, the absolute change in refractive index is related to the degree of domain inversion.

Domain inversion is easily accomplished by the concentration gradient effect utilizing high temperature diffusion. Other means to achieve selective domain reversal in the waveguide material are operative in the present invention if the result is two waveguide channels of opposite polarity. Thus for example, one can, according to the present invention, diffuse titanium onto both legs of a Mach-Zehnder interferometer at a temperature below that for domain inversion and then by selectively heating only one leg by means of, for example, laser heating, to induce reverse poling in that leg. This will result in an interferometer such as an electric field sensing device with reverse polarity.

In the temperature gradient effect, a temperature gradient of 100 degrees Centigrade/centimeter across the sample thickness results in a similar effect to that observed under electric fields. When a sample is heated above its Curie temperature and cooled while maintaining a temperature gradient, the material gets poled in an orientation which is related to the thermal gradient sign. If the same crystal is then quickly heated above $T_c$ and cooled to room temperature without any temperature gradient, the sample gets poled in an orientation which is opposite to that of the starting material. This results in domain inversion in the crystal. In the present invention, the temperature gradient effect can be used to achieve reversal of polarity in a waveguide channel, or a portion thereof, by laser heating, wherein the waveguide channel is exposed to a laser beam of sufficient energy and for sufficient time to locally heat the desired portions of the waveguide channel. In this manner the heating is controlled so as to allow selective domain reversal of one channel or leg of a Mach-Zehnder interferometer without domain inverting another leg. The type of laser which can be used in this process is not a limitation herein, and lasers useful for this purpose are well known in the art. Examples of lasers operative herein for achieving the temperature gradient effect are the carbon dioxide ($CO_2$), neodymium-YAG, argon-ion, and the like.

Domain reversal in lithium niobate can also be achieved with electron beam bombardment at 600 degrees Centigrade with an applied electric field of 10 V/cm and a beam energy of 1.8 MeV for a 1 mm thick crystal. The domain reversal can be achieved in lithium tantalate at 400 degrees Centigrade with an applied electric field of 900 V/cm and a beam energy of 1.8 MeV for a 1 mm thick crystal. In this technique, a gold film patterned by photolithography is used to protect the rest of the crystal from being bombarded by the electron beam except where domain reversal is desired. An electric field is applied to this gold electrode during the process of electron bombardment. The gold metal layer is removed after the domain reversal process.

Thus, one key to the present invention is producing a Mach-Zehnder electric field sensor device in which one leg is at least partially reverse poled relative to the other leg. It is preferred in the present invention that the degree of reverse polarity be maximized and most preferably the domain reversal is essentially 100%.

By the present invention is also provided a non-metallic electric field sensor which can detect electric fields with a dynamic range greater than 40 dB and an operating frequency from DC up to and beyond 100 GHz.

By "non-metallic" herein is meant the absence of metal, or metal electrodes, or metal electrical connectors, or metal conductors attached to the devices of the present invention. The presence of titanium ions diffused into the waveguide crystal does not make the device metallic since there is no metallic titanium in the sense of metal-like electrical conductivity.

BRIEF DESCRIPTION OF THE DRAWINGS

In describing the preferred embodiments of the invention which is illustrated in the drawings, specific terminology will be resorted to for the sake of clarity. However, it is not intended that the invention be limited to the specific terms so selected and it is to be understood that each specific term includes all technical equivalents which operate in a similar manner to accomplish a similar purpose.

DETAILED DESCRIPTION

Figure 1:
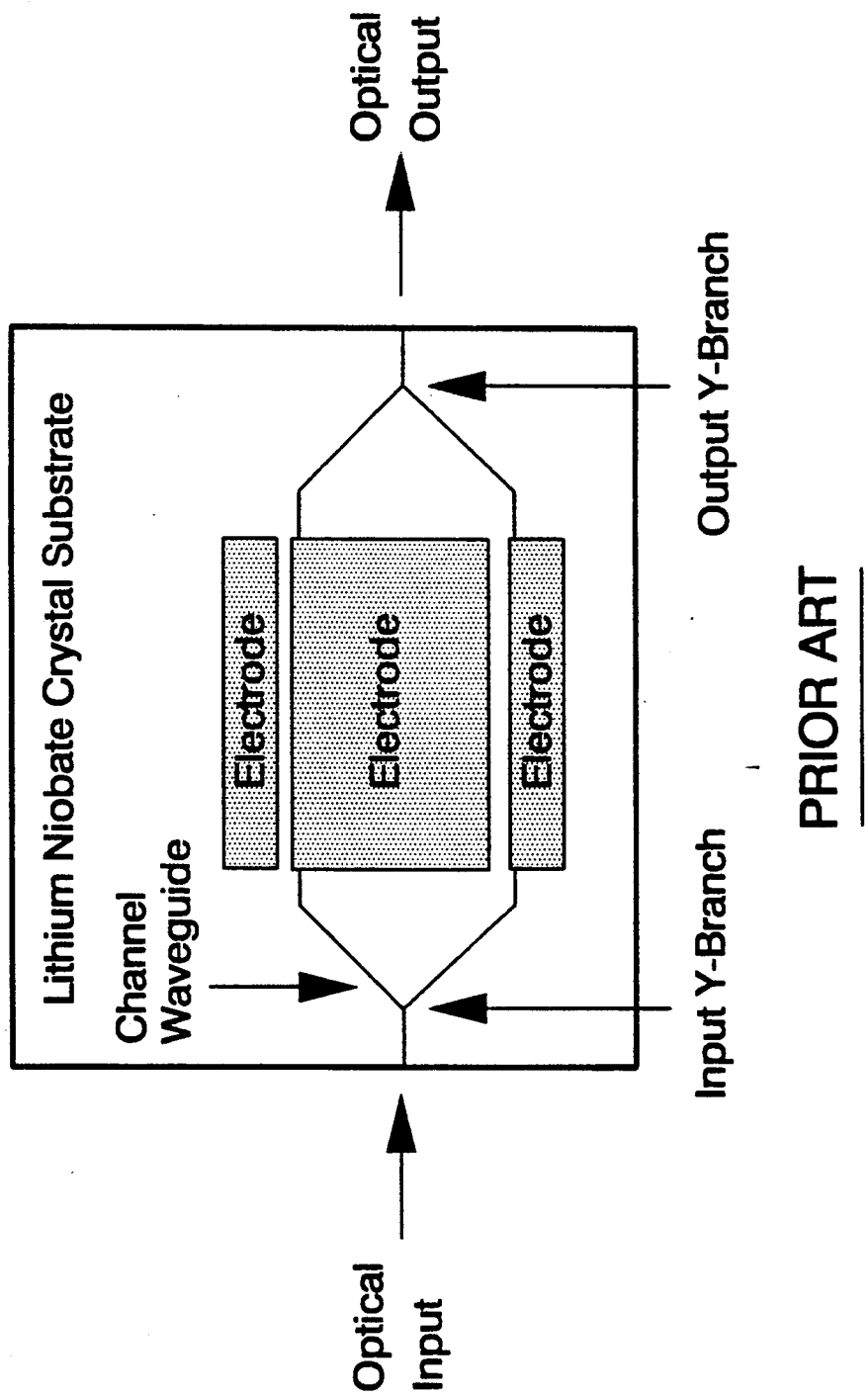
FIG. 1 illustrates a schematic diagram of a conventional Mach-Zehnder interferometer.
Figure 2:
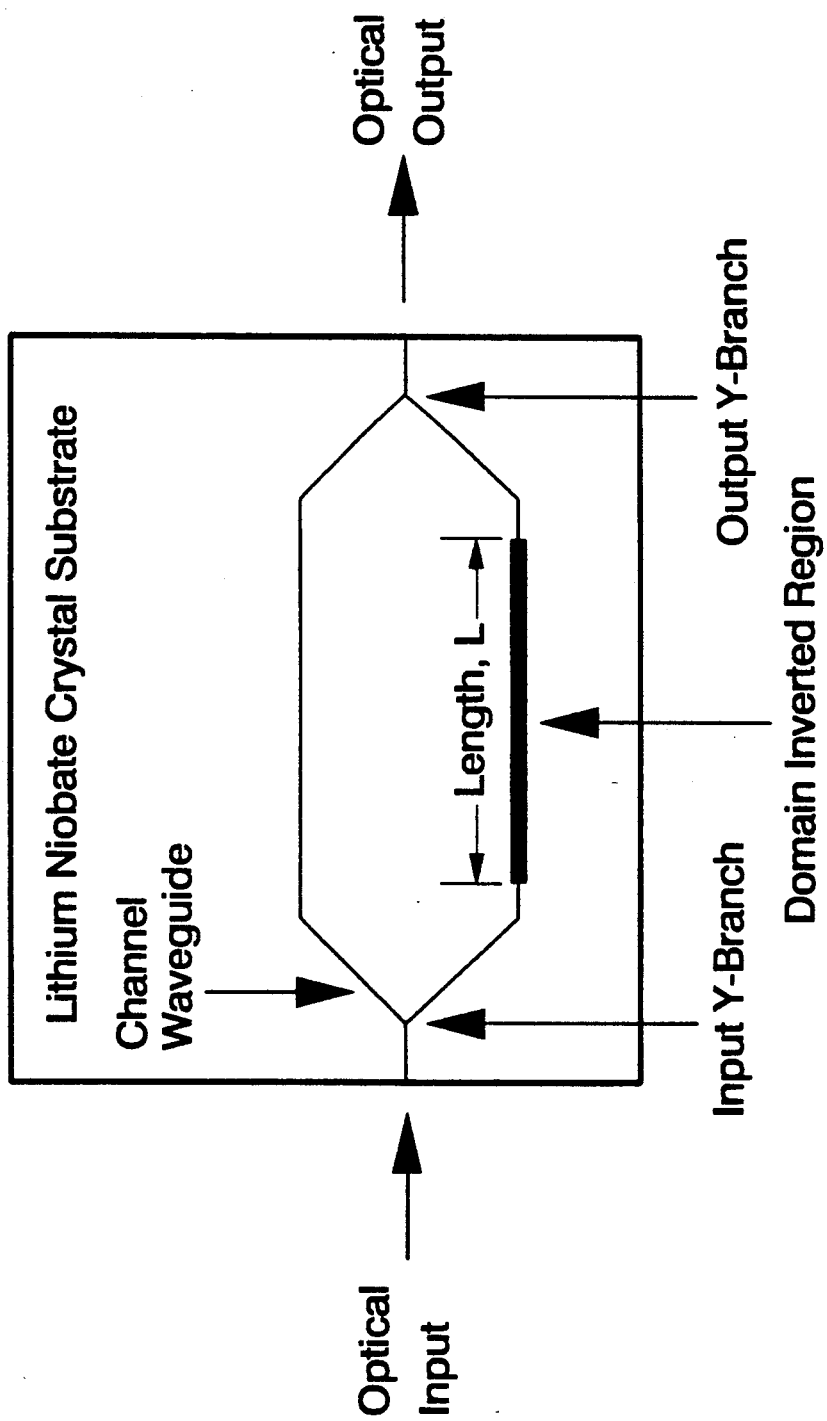
FIG. 2 illustrates an electrode-less Mach-Zehnder interferometer of the present invention.

The present invention relates to an interferometer comprising a plurality of waveguide channels defined on a bulk crystal material, wherein two of the waveguide channels have reverse polarity relative to each other.

The invention also relates to an interferometer comprising two parallel lithium niobate crystal waveguide channels, wherein at least one but less than all of the channels has been titanium diffused for such duration sufficient to diffuse titanium into said channel at a depth greater than 0.1 micron, whereby the titanium diffused waveguide channel is caused to be reverse poled relative to its initial polarity, and wherein the waveguide channels have been proton exchanged by means of exposure to a quantity of acid sufficient to replace at least some of the lithium ions in the waveguide channels with hydrogen ions.

The present invention provides a novel electrode-less, non-metallic, selectively reverse poled Mach-Zehnder interferometer with a crystal waveguide material by combining titanium diffusion into a waveguide channel followed by a proton exchange process. The present invention also provides a novel method of fabrication of an electric field sensor device using selective titanium diffusion of one leg or section of a sensor, whereby reverse poling of that section or leg is achieved, below the Curie temperature of the device's waveguide crystal but in the absence of an electric field. The titanium diffusion procedure utilized in the present invention does not require heating the waveguide to the Curie temperature of the waveguide material. Also, unlike conventional domain inversion techniques, an electric field is not required in the method of the present invention; however, an electric field need not be excluded. The titanium diffused and reverse poled leg of the waveguide exhibits a refractive index increase relative to the refractive index of the non-titanium diffused leg. Subsequently, the Mach-Zehnder waveguide structure is created by a relatively low temperature proton exchange waveguide technique applied to the entire interferometer circuit optionally including the titanium diffused leg. The proton exchange treatment of the titanium diffused leg of the interferometer is preferably directly superimposed over the titanium diffused section of the channel. The total refractive index increase due to the combined titanium diffusion and the proton exchange process produces an electrode-less, non-metallic electric field sensor device in which the optical waveguide permits the propagation of a single transverse optical mode. The process of the invention also produces an electrode-less, non-metallic voltage sensor device. This technique for producing a selectively reverse poled Mach-Zehnder interferometer thus avoids the cumbersome and expensive conventional approach used in poling a crystal, which approach consists of heating the crystal near its Curie temperature or beyond while applying an electric field. The result of the present invention is a single mode, non-metallic, electrode-less, Mach-Zehnder interferometer in which there is an optical path length difference between the two parallel legs. The optical path length is determined by the propagation constant in each leg of the interferometer. The difference in their respective propagation constants comes about because one leg of the interferometer is a proton exchanged waveguide channel and the oppositely poled leg is a titanium diffused and proton exchanged combination waveguide channel.

The process for creating the non-metallic Mach-Zehnder interferometer of the present invention consists in one embodiment of first creating a domain inverted region in one leg or channel of a Mach-Zehnder device. To achieve this selective domain inversion or poling, a layer of titanium extending the length and width of at least one but less than all of the waveguide channels is diffused into the crystal, preferably lithium niobate, $LiNbO_3$, to obtain the domain inversion. The titanium diffusion technique is conventional, and is known to those skilled in the art, as taught, for example, in U.S. Pat. No. 4,284,663.

The polarity of a spontaneous polarization, $P_s$, can be easily distinguished by chemical etching of the titanium diffused surface or an end-face of the waveguide crystal using a hot solution of nitric acid and hydrofluoric acid (2:1). A positive $P_s$ presents a slightly etched pattern while a negative $P_s$ shows a deeply etched pattern.

In the next step of the inventive process, a Mach-Zehnder interferometer is then created by means of exposure of the titanium diffused crystal to a low temperature proton exchange process, e.g., 220 degrees Centigrade, i.e. a temperature below the Curie temperature of the lithium niobate, such that the leg of the Mach-Zehnder channel is aligned on top of the titanium diffused domain inverted channel. Additional benefits of the proton exchange process or an annealed proton exchange process are to reduce or minimize the propagation loss, increase the extraordinary refractive index of the waveguide, and improve the immunity to optical damage. The proton exchange process may also decrease the ordinary index. The proton exchange process is conventional, known to those skilled in the art, and is taught, for example, in U.S. Pat. No. 4,984,861.

Ion exchange waveguides are formed by immersing a substrate material in suitable solutions such that ions in the solution enter the substrate to thereby increase the refractive index of the proton exchanged region. Protons ($H^+$ ions) are frequently used as the ions of choice in the ion exchange process in lithium niobate.

The ion exchange process used in the present invention can be any method which provides a source of cations to replace some of the lithium atoms in the lithium niobate crystal to thereby increase the refractive index. Such cations can include, for example and without limitation, sodium ions, hydrogen ions or protons, potassium ions, magnesium ions, calcium ions, aluminum ions, gallium ions, arsenic ions and germanium ions. The preferred ion exchange treatment is proton exchange using a solution comprising a carboxylic acid or acids, such as benzoic acid.

While lithium niobate is the preferred crystal material for the waveguide channels, lithium tantalate and potassium titanyl phosphate are also useful herein. Lithium tantalate is very similar in its properties to lithium niobate and, in fact, is capable of allowing a much higher level of optical power through its waveguide compared to lithium niobate. Unfortunately, the technique of lithium tantalate domain inversion using titanium diffusion requires temperature beyond 900 degrees Centigrade, which is higher than the 660 degrees Centigrade Curie temperature of lithium tantalate. Since transition beyond the Curie temperature would convert the material from its desirable ferroelectric phase to the less preferred paraelectric phase, this technique of domain inversion is not optimum for lithium tantalate. On the other hand, since the Curie temperature of lithium niobate is about 1200 degrees Centigrade, the titanium diffusion at a temperature beyond 900 degree Centigrade does not affect its ferroelectric properties. Lithium niobate is well known to be ferroelectric below its Curie temperature. Potassium titanyl phosphate is expected to act as a waveguide material much like lithium niobate.

Thus, according to the present invention, a titanium layer of about 10 to 5000 angstroms thick is deposited on lithium niobate, for diffusion at a temperature of 900 to below $T_c$ of the waveguide substrate material, for a diffusion time of about 5 minutes to 30 hours.

PREPARATION OF THE WAVEGUIDE CHANNELS

The preferred waveguide crystal material of the present invention is lithium niobate. $LiNbO_3$ has a three fold axis of symmetry, a density of 4.64 grams/$cm^3$ and a melting point of 1253 degrees Centigrade. It has a Moh hardness of 5 and thermal conductivity of about $10^{-12}$ calories/cm.S.C. The refractive index of the crystal depends on crystal composition. $LiNbO_3$, commercially available from Crystal Technology Incorporated, Palo Alto, Calif., has a Li/Nb mole ratio of 0.946. Being a negative uniaxial crystal, the extraordinary index, $n_e$, is less than the ordinary refractive index, $n_o$. Lithium niobate is a preferred waveguide crystal because it is ferroelectric, and is characterized by high piezoelectric, electro-optic, pyroelectric, and photo-elastic coefficients. Below its Curie temperature of about 1200 degrees Centigrade, the crystal is in its ferroelectric phase; and above $T_c$ it is in its paraelectric phase. However, by the present invention, temperatures above the $T_c$ are not attained. In its ferroelectric phase, it consists of planar sheets of oxygen atoms in a distorted hexagonal close-packed configuration. The octahedral interstices formed in this structure are one third filled by lithium atoms, one third filled by niobium atoms, and one third vacant.

Figure 3:
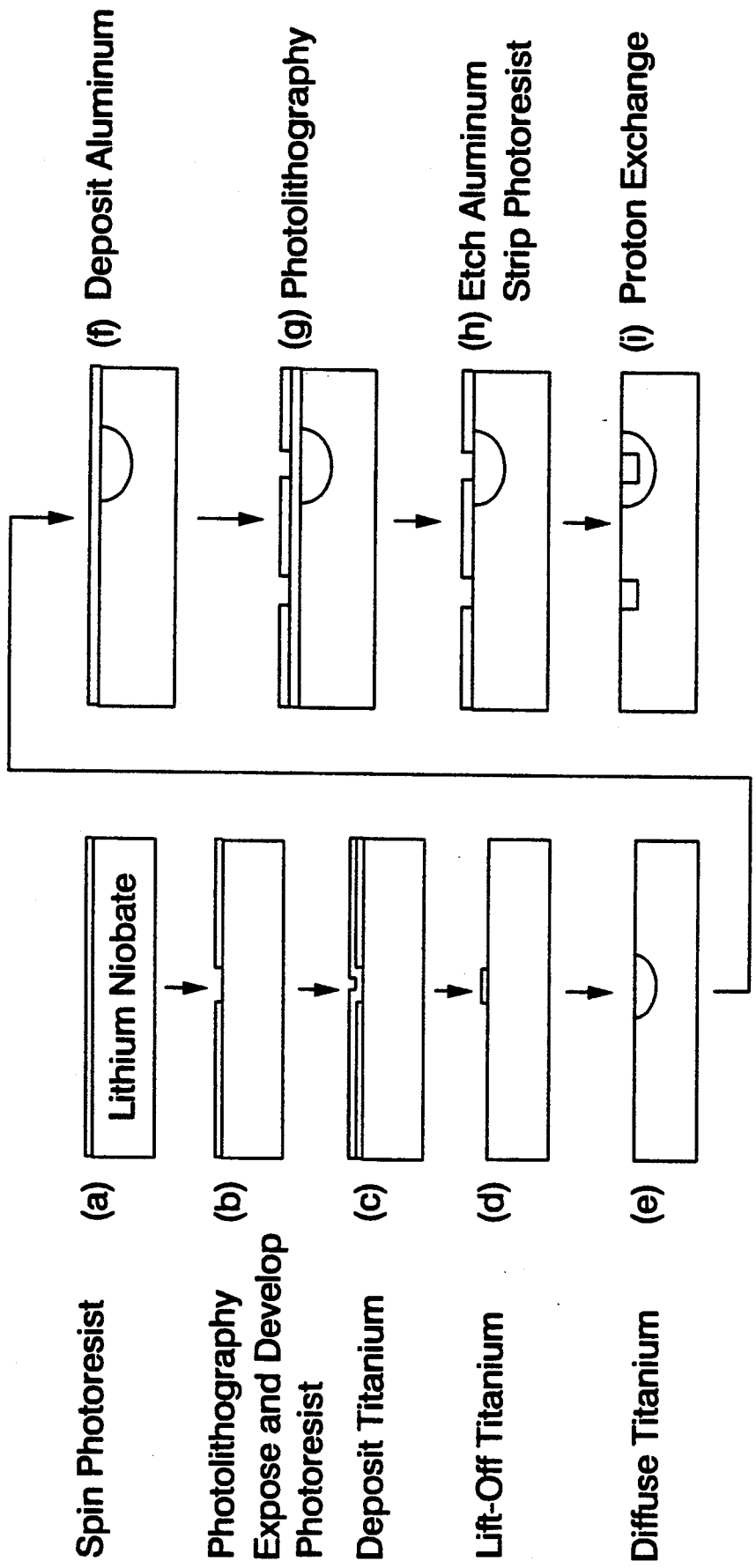
FIGS. 3(a)-(i) illustrate steps (a) through (i) of producing a device with reverse poled waveguide regions.

Waveguide channels are prepared in the lithium niobate crystal by means of confining the titanium deposition for diffusion in the lithium niobate waveguide crystal to a preferred width by using the well known photolithographic process (FIG. 3). A layer of UV sensitive photoresist is coated onto the substrate. A photomask that has the required pattern written on it is placed on top of this substrate in a mask aligner. The photoresist is exposed to a UV light source through the photomask to cure the photoresist. When the substrate is processed in developer solution, the cured photoresist layer is etched off from regions that were exposed through the photomask. A layer of Ti is deposited, by any of the several known techniques, to cover the entire surface of the substrate. When this substrate is soaked in acetone, the photoresist is removed and thus lifts off the Ti metal that is on top of the photoresist. Ti metal is present only in regions of the substrate that had the photoresist etched in the earlier step. The substrate is cleaned and is ready for diffusion.

Titanium Diffusion

Titanium diffusion into one leg of the waveguide channel in a +Z oriented crystal substrate will result in selective reverse poling of that leg. Thus, an experiment to characterize the degree of depoling (or domain inversion) was carried out by diffusing Ti at several temperatures from 1000 to 1050 degrees Centigrade for 8 hours. The substrate was placed on an alumina boat which was positioned in the center zone of an open tube furnace. The furnace atmosphere was oxygen at a flow rate of about 0.1 to 1 standard liters per minute. The lithium niobate crystal was surrounded by lithium niobate powder to prevent outdiffusion of lithium from the crystal at elevated temperature. The furnace temperature was gradually increased over a two hour period so as to not thermally shock the crystal.

A virgin Z oriented LiNbO$_3$ was etched in the acid solution described above. The +Z surface of the crystal surface is normally resistant to the acid etch solution and the −Z surface of the crystal shows etch pits. A −Z oriented LiNbO$_3$ substrate was diffused with 1000 Angstroms of Ti at 1025 degrees Centigrade for 8 hours. After diffusion, the crystal was etched in the above mentioned solution. The etch pits thus produced were typical of the −Z oriented surface of the virgin lithium niobate crystal. The etch pits produced in the −Z surface of LiNbO$_3$ are identical for the titanium and non-titanium diffused surfaces.

But, after Ti diffusion of both 1000 and 500 Angstroms, the +Z surface exhibits deeply etched patterns. The etch pattern on the Ti diffused +Z surface is identical to that of the −Z surface obtained earlier. This indicates that in the present invention the Ti diffused layer in the +Z surface behaves in the fashion of a −Z surface thereby demonstrating that a domain inversion has taken place in that region.

The degree of domain inversion is estimated from the etch pit density. By comparing the etch pits obtained on titanium-diffused −Z and +Z surfaces, which etch densities were identical, it is clear that the present invention produced a 100% domain inversion or polarization reversal by the diffusion of 1000 angstroms of Ti on a +Z surface to thereby create a −Z surface.

Channel waveguides were also created for several widths ranging from 2 to 15 microns. The thickness of the Ti was 1000 Angstroms and the diffusion was carried out at 1025 degrees Centigrade for 8 hours. The 5 micron and smaller-width guides exhibited partial domain inversion whereas guide widths of 6 microns or greater were 100% depoled or domain inverted. The Ti concentration in the 5 micron and smaller guides, however, was not sufficient to create 100% depoling. Hence, a thicker Ti layer would achieve the desired polarization reversal in waveguides of these smaller widths.

The diffusion operation was also carried out at a temperature of 1050 degrees Centigrade for 8 hours for Ti thickness of 1000 Angstroms. The higher diffusion temperature led to further diffusion of Ti and, thus, a decrease in the concentration gradient. This reduction in the titanium concentration gradient leads to a less than 100% domain inversion as evidenced by lower etch pit density. The test described above for polarity using chemical etching with hot nitric acid and hydrofluoric acid was performed on the polished +Y and −Y end-faces of the titanium diffused waveguide channel in a +Z oriented lithium niobate crystal. The property of this etch solution is such that the +Y face is etched and leaves the −Y face intact. The results of the etching test indicated that the +Y end-face associated with the Ti diffused region was converted to −Y orientation, i.e., the Ti diffused channel was domain inverted to −Z in the +Z substrate. Similarly, the features observed on the −Y end-face were exactly the opposite those of the +Y face; the Ti diffused region exhibited etch pits whereas the background, the −Y face, remained smooth.

This domain inversion selectively occurs only in the Ti diffused regions. By the present invention, 100% domain inversion can be achieved by choosing appropriate Ti diffusion conditions, preferably a +Z lithium niobate surface diffused with 1000 angstrom thick Ti at 1025 degrees Centigrade for 8 hours. Since the diffusion takes place below 1200 degrees Centigrade, which is the Curie temperature of lithium niobate, the rest of the crystal substrate retains its original state of polarization. The preferred depth of diffusion of Ti is at least two microns deeper than the proton exchange depth. The preferred width of the Ti channel is greater than 5 microns. This process results in no degradation in the electro-optic properties of the crystal, and produces one waveguide channel which has been Ti diffused to induce reverse poling therein.

Proton Exchange

The process of creating the waveguide structure must be such that it does not degrade the previous process performed on the crystal. There are two well established processes for fabricating waveguides in lithium niobate. Titanium diffusion and proton exchange in organic acids are routinely used to create waveguides in lithium niobate. Both processes are useful herein but the proton exchange in organic acids is preferred as will be explained below. The high temperature diffusion of Ti (i.e., 1000 degrees Centigrade) would further diffuse the Ti already present in the domain inverted region and thus could severely degrade the waveguide performance in this region. In addition, excessive out-diffusion of Li from the lithium niobate could lead to unwanted surface guides.

The preferred approach to waveguides useful in the present invention is the so-called proton exchange process. The temperature in this process is in the range of 200 to 400 degrees Centigrade and would therefore not affect the Ti diffused domain inverted regions or the crystal substrate. Protons from benzoic acid exchange with Li ions in lithium niobate to form the waveguide. In order to obtain optical waveguides, only a partial exchange is required. In fact, 100% exchange of H$^+$ for Li$^+$ leads to changes in the crystal structure and cracking of the crystal due to excessive stress.

The exchange process is accomplished by using either pure benzoic acid or benzoic acid diluted with lithium benzoate. The preferred process temperature is in the range of 200 to 400 degrees Centigrade. The process time depends on the type of waveguide, i.e., single or multimode and its wavelength of operation. The exchange time is typically 10 minutes to several hours, again depending on the type of waveguide required.

Since proton exchange waveguides are known to be unstable due to possible further migration of protons within the thickness of the guiding layer, an annealing operation after the proton exchange process was carried out in flowing oxygen at 350 degrees Centigrade for 2 hours to obtain single mode waveguides at 0.83 micron wavelength. This dramatically reduced the scattering and propagation loss, and the resulting device did not exhibit any degradation in the electro-optic effect.

The proton exchange process produces a waveguide which is truly single mode. This process only increases the extraordinary refractive index with a slight decrease in the index of the ordinary ray. This permits only a single polarization to propagate in the waveguide which is of importance in a Mach-Zehnder interferometer, this being a polarization sensitive unit.

In addition, the proton exchange waveguides exhibit higher optical damage threshold compared to Ti diffused waveguides. Hence, this will allow greater optical power to propagate in the proton exchanged waveguide, resulting in greater device sensitivity.

Process Sequence

In the process for preparing a Mach-Zehnder electric field sensor according to the present invention, titanium is diffused into a region of a lithium niobate substrate to create a domain inverted region as described in the procedure above. A thin layer of aluminum, about 1000 angstroms thick, is deposited on the surface of the crystal. Next, a layer of photoresist is applied and the waveguide pattern is defined on the photoresist using photolithography. In the photolithographic step, a photomask, which has the waveguide pattern written on it, is placed on the top of the photoresist-coated substrate. The photoresist is exposed, through the photomask, using UV light source. After exposure, the substrate is developed in a developer solution. The photoresist is thus removed in areas where the waveguide is to be defined. The underlying aluminum layer is etched using photoresist as a protective layer to prevent the aluminum from etching in areas underneath the photoresist. The substrate is then immersed in a benzoic acid melt at, for example, 220 degrees Centigrade. The proton exchange takes place only in regions where the aluminum has been etched and one leg of the proton exchange waveguide is superimposed over the Ti diffused domain inverted region. The aluminum layer prevents the proton exchange process from taking place underneath the aluminum. After completing the proton exchange process, the aluminum layer is completely removed in phosphoric acid. The crystal is then annealed in flowing oxygen at 350 degrees Centigrade for about 2 hours to form the desired waveguide device.

FIG. 3 illustrates the preferred sequence of steps in the present invention. Step (a) represents a photoresist coating which has been deposited by, for example, spin deposition onto the lithium niobate crystal. In step (b) the photoresist is exposed and developed using known photolithographic techniques. In step (c), titanium is deposited over the developed photoresist to a layer of for example 10 to 5000 angstroms. In step (d), the photoresist is lifted off by means of soaking in a solvent such as acetone, followed in step (e) by diffusion of the titanium into the lithium niobate by heating to about 1025 degrees Centigrade for about eight hours, whereby a Ti diffused region of domain reversal is produced in the crystal. Onto this is deposited in step (f) a layer of aluminum of, for example, 1000 angstroms. In step (g), another photoresist is deposited using photolithography followed by exposure and development techniques. Step (h) illustrates the etching of the aluminum and stripping of the photoresist. The proton exchange procedure of step (i) exposes the crystal to benzoic acid, at a temperature in the range of 200 to 400 degrees Centigrade for about 5 minutes to 2 hours, in the portions where the aluminum has been etched. The aluminum is then stripped by exposure to an acid, and the device can optionally be annealed in oxygen at a temperature in the range of about 200 to 400 degrees Centigrade for about 10 minutes to 20 hours.

According to the process described above for the present invention, a Mach-Zehnder interferometer device was fabricated which was operative as a sensor for electric fields. The device was non-metallic, electrodeless and when placed in free space and exposed to an electric field, the device could detect electric field. Thus in one embodiment of the present invention, an electric field sensor was produced as described above.

Using Ti diffusion to a depth of about 7 microns to induce domain inversion in one of a plurality of waveguide channels defined on a lithium niobate crystal, an integrated optical waveguide device was produced. This device was tested using the set ups of FIG. 4 and FIG. 5.

Figure 4:
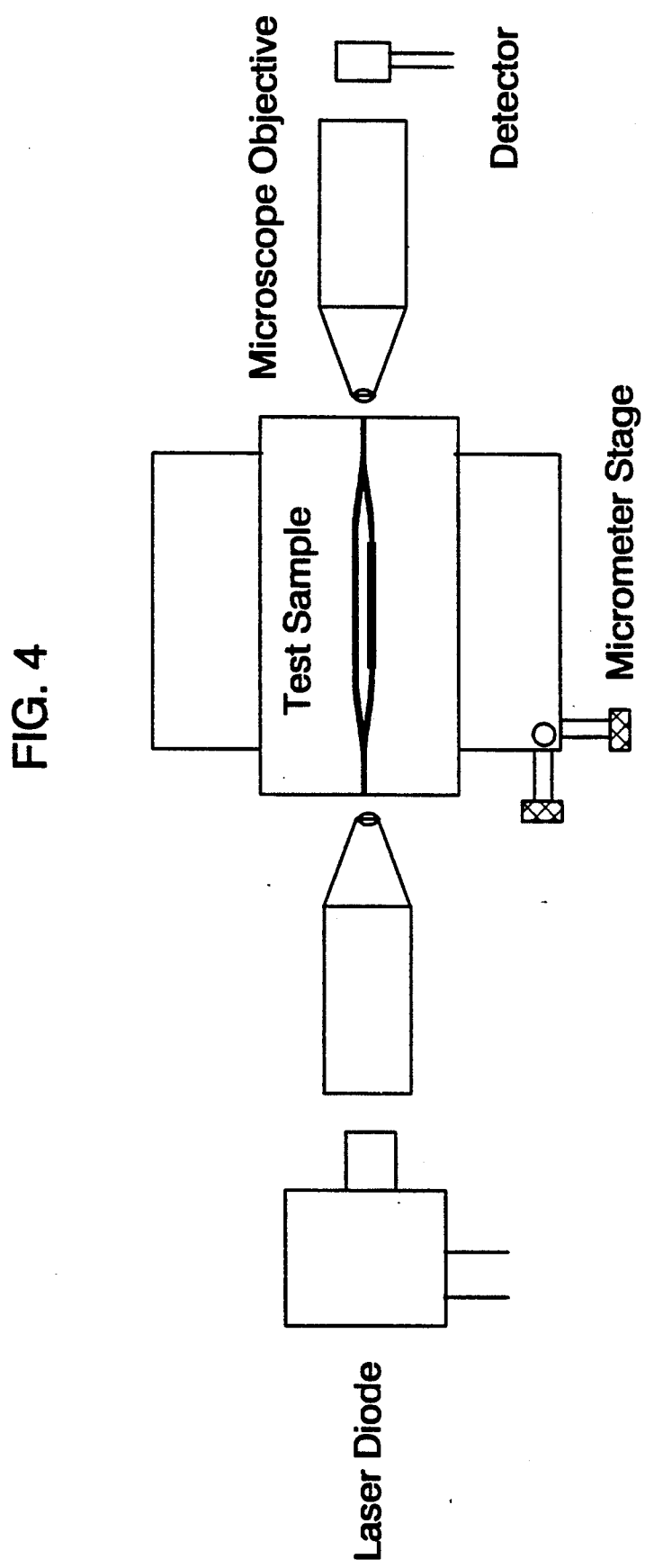
FIG. 4 illustrates an optical test set up for observing the properties of the devices of the present invention.

FIG. 4 illustrates the optical set up for testing light propagation in the devices of the present invention. A laser operating at 0.83 micron wavelength was focused by means of a microscope objective to the input polished end-face of, for example, a Mach-Zehnder interferometer device. The output light from the interferometer was collected using a microscope objective and imaged onto a photodetector. The photodetector output was observed using a spectrum analyzer and an oscilloscope.

Figure 5:
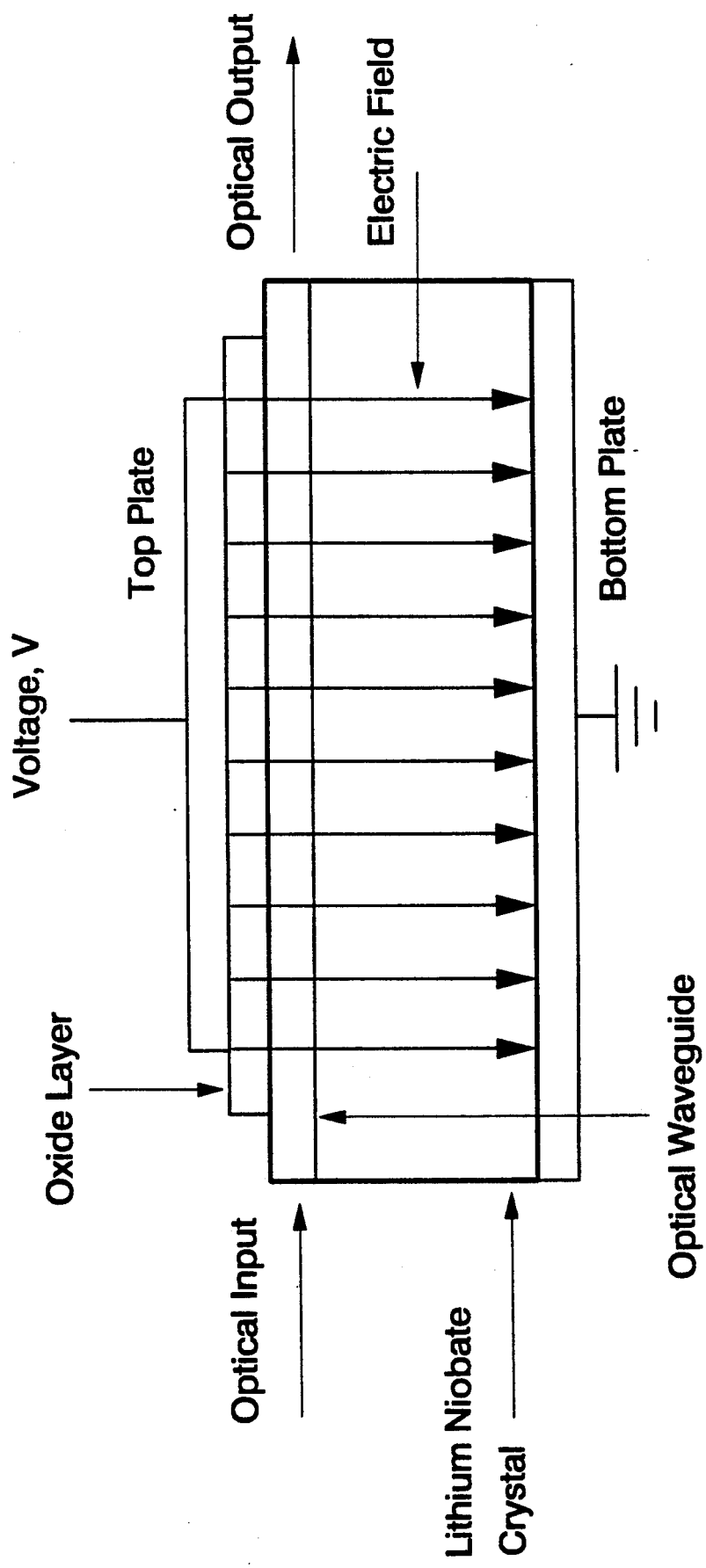
FIG. 5 illustrates a schematic diagram of a parallel plate capacitor to electro-optically test the properties of a device of the present invention.

FIG. 5 illustrates the set up for electro-optically testing the device of the present invention in a laboratory setting. An electric field was produced in the laboratory by placing the lithium niobate Mach-Zehnder interferometer produced as in FIG. 3 between two metal plates that form a capacitor. This capacitor configuration produces uniform electric field that is sufficient to test the principle of operation of the electric field sensor. Low frequency AC electric fields at 1 kHz were produced for test purposes. The electrical circuit to the capacitor was also arranged to be capable of also applying DC electric field to the sensor.

The results of the tests based on FIG. 4 and FIG. 5 confirmed that the optical beam or signal propagating in the Mach-Zehnder interferometer was modulated at the same frequency as the input electrical signal to the parallel plate capacitor. The optical signal was converted to an electrical signal by a photodetector and observed on a spectrum analyzer and an oscilloscope. The optical signal was modulated by the electric field at 1 kHz. Increasing or decreasing the amplitude of the applied electric field was observed to increase or decrease, respectively, the output optical signal level observed on the spectrum analyzer and oscilloscope instruments.

Thus, in another embodiment, the present invention produces an electrode-less optical interferometric modulator comprising an input waveguide section, an input branching section for dividing an optical signal on said input section into two substantially equal portions, a means for applying an electric field to the branch waveguides in the modulator, first and second branch waveguides for transmitting the two portions of the divided optical signal, an output branching section for combining the optical signals on said first and second branch waveguides to form an output optical signal, characterized in that said first and second branch waveguides are of reverse polarity relative to each other, whereby the optical output signal is modulated at the same frequency as the electrical field.

Also provided is an improved method of modulating an optical signal when a voltage is applied to an electro-optic crystal such as lithium niobate, said method comprising the steps (a) exposing to an electric field a Mach-Zehnder interferometer in which at least one but less than all of the waveguide channels has been reverse poled; (b) introducing an optical input signal to the Mach-Zehnder interferometer, whereby the optical signal is modulated within the Mach-Zehnder interferometer by the electric field.

The useful wavelength of the devices of the present invention is not limited to 0.83 microns but can in fact range from the visible to infrared wavelengths. The limitation of the useful wavelengths of the devices of the present invention is defined by the transmission spectrum of the waveguide material, such as lithium niobate. Lithium niobate is transparent to optical radiation of 0.4 to 5 micron wavelength.

In another embodiment of the present invention, a directional coupler can be used to replace the output Y-branch of the interferometer to recombine the optical signal without any loss of energy to the substrate. The directional coupler is designed and fabricated such that the two output ports have equal intensities. In this embodiment is the advantage of both outputs always being out of phase which can be used to increase the carrier-to-noise ratio of the electric field sensor. This is often called the dual-balanced photodetection technique, and provides a basic 3 dB increase in signal-to-noise and substantial suppression of excess intensity noise from the optical source.

In another embodiment of the present invention, alternate segments of domain inverted regions are placed in both legs of the Mach-Zehnder interferometer. This is sometimes referred to as the periodic phase reversal technique. In one design, the individual domain inverted segments in the two legs of the interferometer have equal lengths. The length of each individual segment determines the center frequency of operation of the sensor. The sum total of all the domain inverted segment lengths in both the legs determines the device sensitivity and the device bandwidth.

It is not necessary that the individual segment lengths be equal. Device geometry having non-equal segment lengths could also be used based on specific design requirements.

While certain preferred embodiments of the present invention have been disclosed in detail, it is to be understood that various modifications may be adopted without departing from the spirit of the invention or scope of the following claims.

That which is claimed is:

1. An integrated optical waveguide device comprising a plurality of waveguide channels defined on a crystal material, wherein two of the waveguide channels have reverse polarity relative to each other.

2. An electrode-less Mach-Zehnder interferometer comprising a plurality of waveguide channels defined in a crystal material, wherein two of the waveguide channels have reverse polarity relative to each other, and wherein t he interferometer has no metallic components.

3. The interferometer of claim 2 wherein the interferometer comprises an electric field sensor.

4. The interferometer of claim 2 wherein the waveguide channels are adapted to receive a divided optical signal.

5. The interferometer of claim 2 wherein the interferometer comprises a voltage sensor.

6. The interferometer of claim 2 wherein the interferometer comprises an electro-optical signal modulator.

7. The interferometer of claim 2 wherein the interferometer comprises an electro-optical antenna capable of sensing electric fields.

8. The Mach-Zehnder interferometer of claim 2 wherein the reverse polarity of the waveguide channels is achieved by a method selected from the group consisting of titanium diffusion of at least one channel below $T_c$ of the waveguide material in the absence of an electric field, followed by proton exchange; titanium diffusion of at least one channel above $T_c$ of the waveguide material in the presence of an electric field followed by proton exchange; titanium diffusion of an interferometer below the temperature for domain inversion of the waveguide material followed by a temperature gradient effect induced by laser heating a channel and without subsequent proton exchange treatment; selective electron beam bombardment of at least one but less than all of the waveguide channels; titanium diffusion of both legs at a temperature above the $T_c$ of the waveguide material, each in the presence of a separate electric field, wherein said electric fields are opposite polarities and followed by either proton exchange treatment or titanium diffusion at a temperature below domain inversion; proton exchange and annealing below the $T_c$ of at least one but less than all of the waveguide channels; laser and non-laser temperature gradient effect of at least one but less than all of the waveguide channels; and ionic concentration gradient effect of at least one but less than all of the waveguide channels.

9. The Mach-Zehnder interferometer of claim 2 wherein the crystal material is lithium niobate.

10. The Mach-Zehnder interferometer of claim 2 wherein the crystal material is lithium tantalate.

11. An electric field sensor comprising an integrated optical waveguide device comprising a plurality of waveguide channels on a crystal material, wherein two of the waveguide channels have reverse polarity relative to each other, wherein one of said waveguide channels has titanium diffused therein, said diffusion being at a temperature below the Curie temperature of the crystal material followed by proton exchange treatment of the waveguide channels.

12. The electric field sensor of claim 11 wherein the crystal material is lithium niobate.

13. The electric field sensor of claim 11 wherein at least one but less than all of the waveguide channels is exposed to selective electron beam bombardment.

14. The electric field sensor of claim 11 wherein the reverse polarity of the waveguide channels is achieved by laser irradiation of at least one but less than all of the waveguide channels.

15. The electric field sensor of claim 11 wherein the reverse polarity of the waveguide channels is achieved by a method selected from the group consisting of titanium diffusion of at least one channel below $T_c$ of the waveguide material in the absence of an electric field, followed by proton exchange; titanium diffusion of at least one channel above $T_c$ of the waveguide material in the presence of an electric field followed by proton exchange; titanium diffusion of an interferometer below the temperature for domain inversion of the waveguide material followed by a temperature gradient effect induced by laser heating a channel and without subsequent proton exchange treatment; selective electron beam bombardment of at least one but less than all of the waveguide channels; titanium diffusion of both legs at a temperature above the $T_c$ of the waveguide material, each in the presence of a separate electric field, wherein said electric fields are opposite polarities and followed by either proton exchange treatment or titanium diffusion at a temperature below domain inversion; proton exchange and annealing below the $T_c$ of at least one but less than all of the waveguide channels; laser and non-laser temperature gradient effect of at least one but less than all of the waveguide channels; and ionic concentration gradient effect of at least one but less than all of the waveguide channels.

16. The electric field sensor of claim 11 wherein the waveguide channels are parallel to each other.

17. An electrode-less Mach-Zehnder interferometer comprising a plurality of waveguide channels defined in a crystal material, wherein two of the waveguide channels have reverse polarity relative to each other, and wherein the interferometer has no metallic components, and wherein the reverse polarity is achieved by titanium diffusion into at least one but less than all of said waveguide channels.

18. The Mach-Zehnder interferometer of claim 17 wherein the reverse polarity is achieved in the absence of an electric field.

19. An electrode-less Mach-Zehnder interferometer comprising a plurality of waveguide channels defined in a crystal material, wherein two of the waveguide channels have reverse polarity relative to each other, and wherein the interferometer has no metallic components, and wherein the crystal material is potassium titanyl phosphate.

20. An electrode-less Mach-Zehnder interferometer comprising a plurality of waveguide channels defined in a crystal material, wherein two of the waveguide channels have reverse polarity relative to each other, and wherein the interferometer has no metallic components, and wherein one of said waveguide channels has titanium diffused therein, wherein the titanium diffuses in the waveguide material to a depth greater than 0.10 microns.

21. An electrode-less Mach-Zehnder interferometer comprising a plurality of waveguide channels defined in a crystal material, wherein two of the waveguide channels have reverse polarity relative to each other, and wherein the interferometer has no metallic components, and wherein two of the waveguide channels possess an optical length difference relative to each other sufficient to produce quadrature phase bias.

22. An electrode-less Mach-Zehnder interferometer comprising a plurality of waveguide channels defined in a crystal material, wherein two of the waveguide channels have reverse polarity relative to each other, and wherein the interferometer has no metallic components, and wherein two of the waveguide channels possess an optical length difference relative to each other sufficient to produce $\pi$ radian phase bias.

23. An interferometer comprising:
at least two parallel lithium niobate crystal waveguide channels, wherein at least one but less than all of the channels has been titanium diffused for such duration sufficient to diffuse titanium into said channel at a depth of at least 0.10 microns, whereby the titanium-diffused waveguide channel is caused to be reverse poled relative to its initial polarity, and wherein the waveguide channels have been proton exchanged by means of exposure to acid sufficient to replace at least some of the lithium ions in the waveguide channels with hydrogen ions.

24. An improved method of modulating an optical signal when a voltage potential is applied to an electro-optic crystal, said method comprising the steps:
(a) exposing to a voltage potential a Mach-Zehnder interferometer comprising an electro-optic crystal in which at least one but less than all of the waveguide channels thereon has been reverse poled;
(b) introducing an optical input signal to the Mach-Zehnder interferometer, whereby the optical signal is modulated within the Mach-Zehnder interferometer by the voltage potential.

25. The method of claim 24 wherein the electro-optic crystal is lithium niobate.

26. An electrode-less optical interferometric modulator comprising:
an input waveguide section;
an input branching section for dividing an optical signal on said input section into two substantially equal portions;
first and second branch waveguides for transmitting the two portions of the divided optical signal;
an output branching section for combining the optical signals on said first and second branch waveguides to form an optical output signal;
a means for applying an electric field to the branch waveguides in the modulator;
characterized in that said first and second branch waveguides are of reverse polarity relative to each other, whereby the optical output signal is modulated at the same frequency as the electric field.

27. The optical interferometric modulator of claim 26 further comprising a means for optically decoupling said first and second branch waveguides.

28. An electrode-less, non-metallic voltage sensor comprising a plurality of waveguide channels defined on a crystal material, wherein two of the waveguide channels have reverse polarity relative to each other.

29. An electrode-less, non-metallic voltage sensor comprising a plurality of waveguide channels defined on a crystal material, wherein two of the waveguide channels have reverse polarity relative to each other, and wherein one of said waveguide channels has titanium diffused therein, said diffusion being at a temperature below the Curie temperature of the crystal material.

30. The voltage sensor of claim 29 wherein the crystal material is lithium niobate.

* * * * *